(12) United States Patent
Jeong

(10) Patent No.: US 10,841,984 B2
(45) Date of Patent: Nov. 17, 2020

(54) SIDE MIRROR STRUCTURE HAVING INTEGRATED CIRCUIT

(71) Applicants: HYUNDAI MOTOR COMPANY, Seoul (KR); KIA MOTORS CORPORATION, Seoul (KR)

(72) Inventor: Hae Won Jeong, Gwangmyeong-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 192 days.

(21) Appl. No.: 16/136,045

(22) Filed: Sep. 19, 2018

(65) Prior Publication Data

US 2019/0335546 A1 Oct. 31, 2019

(30) Foreign Application Priority Data

Apr. 26, 2018 (KR) ........................ 10-2018-0048471

(51) Int. Cl.
*H05B 3/84* (2006.01)
*B60R 1/12* (2006.01)
*H05K 1/18* (2006.01)
*H05B 45/40* (2020.01)
*B60R 1/06* (2006.01)

(52) U.S. Cl.
CPC ........... *H05B 3/845* (2013.01); *B60R 1/1207* (2013.01); *H05B 45/40* (2020.01); *H05K 1/189* (2013.01); *B60R 1/0602* (2013.01); *H05B 2203/003* (2013.01); *H05K 2201/10106* (2013.01)

(58) Field of Classification Search
CPC ............ H05B 3/8445; H05B 2203/003; B60R 1/0602
See application file for complete search history.

(56) References Cited

U.S. PATENT DOCUMENTS

| 6,316,746 B1* | 11/2001 | Golston | H05B 3/845 |
| | | | 219/219 |
| 2004/0079743 A1* | 4/2004 | White | B60R 1/0602 |
| | | | 219/202 |
| 2011/0168687 A1* | 7/2011 | Door | H05B 3/845 |
| | | | 219/202 |
| 2012/0113660 A1* | 5/2012 | Ishikawa | G02B 6/0038 |
| | | | 362/494 |
| 2017/0086259 A1* | 3/2017 | Du | H05B 3/34 |
| 2018/0070411 A1* | 3/2018 | Wei | H05K 3/1258 |
| 2019/0017676 A1* | 1/2019 | Van Straten | F21S 41/143 |

FOREIGN PATENT DOCUMENTS

| KR | 10-2002-0076607 A | 10/2002 |
| KR | 10-2007-0005306 A | 1/2007 |

* cited by examiner

*Primary Examiner* — Geoffrey S Evans
(74) *Attorney, Agent, or Firm* — Morgan, Lewis & Bockius LLP

(57) ABSTRACT

A side mirror structure includes: a substrate; a mirror glass that is disposed above the substrate; a heat generation circuit that is provided at a first area on a top surface of the substrate, and transmits heat to the mirror glass; and a light emission circuit that is provided at a second area on the top surface of the substrate, and displays a signal on the mirror glass.

9 Claims, 10 Drawing Sheets

-PRIOR ART-

SIDE MIRROR STRUCTURE HAVING INTEGRATED CIRCUIT

CROSS-REFERENCE TO RELATED APPLICATION

This application claims priority to and the benefit of Korean Patent Application No. 10-2018-0048471 filed in the Korean Intellectual Property Office on Apr. 26, 2018, the entire contents of which are incorporated herein by reference.

TECHNICAL FIELD

The present disclosure relates to a side mirror structure having a heat generation circuit and a light emission circuit are formed in one substrate.

BACKGROUND

Recently, as the automatic automobile driving technology has been researched and developed, adoption of new technologies has been increased. Among the new technologies, a blind spot detection (BSD) function is added to warn a driver when the driver changes lanes by lighting a warning light, such as an light-emitting diode (LED), if another vehicle exists in a side mirror blind spot. As a structure used for implementation of the BSD function, a printed circuit board (PCB) where the LED is soldered is inserted to a lower side of the side mirror. In such a structure, a film type of heater and a PCB substrate need to be separately provided and additional wiring is required, thereby increasing complexity in a manufacturing process and causing weight to be increased.

As shown in FIG. 1, a blind spot detection (BSD) logo in a side mirror is lit to warn a driver when a vehicle is detected at a rear side direction in the BSD system. A PCB 30 where an LED element is soldered is disposed at a lower portion of a glass 20, and light having passed through a light guide 40 passes through a film-type heater 10 and the glass 20 and then reaches the driver. The film-type heater 10 is connected to a bottom side of the glass in preparation for bad weather such as rain, snow, moisture, and the like. Since light cannot be transmitted through the film type heater 10, the heater 10 needs a hole 11 for transmission of the light.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to provide a side mirror structure where a heat generation circuit portion and a light emission circuit portion are formed in one substrate.

A side mirror structure according to an exemplary embodiment of the present disclosure includes: a substrate; a mirror glass that is disposed above the substrate; a heat generation circuit portion that is provided at a first area on a top surface of the substrate, and transmits heat to the mirror glass; and a light emission circuit portion that is provided at a second area on the top surface of the substrate, and displays a signal on the mirror glass.

A through-hole that vertically penetrates the substrate may be provided to divide the one area and the other area of the substrate.

The heat generation circuit portion may include a hot wire that is disposed on the substrate and of which one end is connected with a first electrode and the other end is connected with a first counter electrode.

The light emission circuit portion may include: an electric wire that is disposed on the substrate and of which one end is connected with a second electrode and the other end is connected with a second counter electrode; and an LED lamp that is electrically connected to the electric wire.

The light emission circuit portion may include: an electric wire that is disposed on the substrate and of which one end is connected with a second electrode and the other end is connected with the hot wire; and an LED lamp that is electrically connected to the electric wire.

The substrate may be formed of a flexible material.

The mirror glass may be connected to the substrate while contacting the top surface of the substrate, and may further include a plastic panel that contacts a bottom surface of the substrate.

The other area of the substrate may be bent downward, and may further include a reflection portion that is disposed on a side of the light emission circuit portion and may transmit light generated from the light emission circuit portion to the mirror glass.

A width formed from one side of the through-hole to the other side may be about 1 to 50 mm.

The hot wire and the electric wire may be made of copper or a copper alloy material.

A thickness of a cross-section that is formed in a vertical direction of the hot wire and the electric wire may be about 10 to 100 μm.

Since the heat generation circuit portion and the light emission circuit portion are provided on one substrate in the side mirror structure according to the present disclosure, a manufacturing process can be simplified and manufacturing cost can be saved. In addition, the heat generation circuit portion and the wire harness of the light emission circuit portion can be integrally formed, thereby simplifying an assembly process.

DETAILED DESCRIPTION OF THE EMBODIMENTS

Terms such as first, second, and third are used for describing various portions, components, areas, layers, and/or sections, but the terms are not restrictive. The terms are used only for distinguishing any portion, component, area, layer, or section from other portions, components, areas, layers, or sections. Therefore, a first portion, component, area, layer, or section described hereinafter may be described as a second portion, component, area, layer, or section without deviating from the scope of the present disclosure.

Technical terms used herein are used only for describing a specific exemplary embodiment and are not intended to limit the present disclosure. Singular forms used herein include a plurality of forms unless phrases explicitly represent an opposite meaning. A meaning of "comprising" used in the specification embodies a specific characteristic, area, integer, step, operation, element, and/or component and does not exclude the presence or addition of another characteristic, area, integer, step, operation, element, and/or component.

When it is mentioned that a first component is located "above" or "on" a second component, the first component may be located directly "above" or "on" the second component or a third component may be interposed therebetween. In contrast, when it is mentioned that a first component is located "directly above" a second component, a third component is not interposed therebetween.

Unless otherwise defined, all terms including technical terms and scientific terms used here have the same meanings as those which may be generally understood by a person of common skill in the art. Further, terms defined in a generally used dictionary have meanings corresponding to related technical documents and presently disclosed contents, and are not to be construed with idealized or overly official meanings unless so defined.

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

Figure 1:
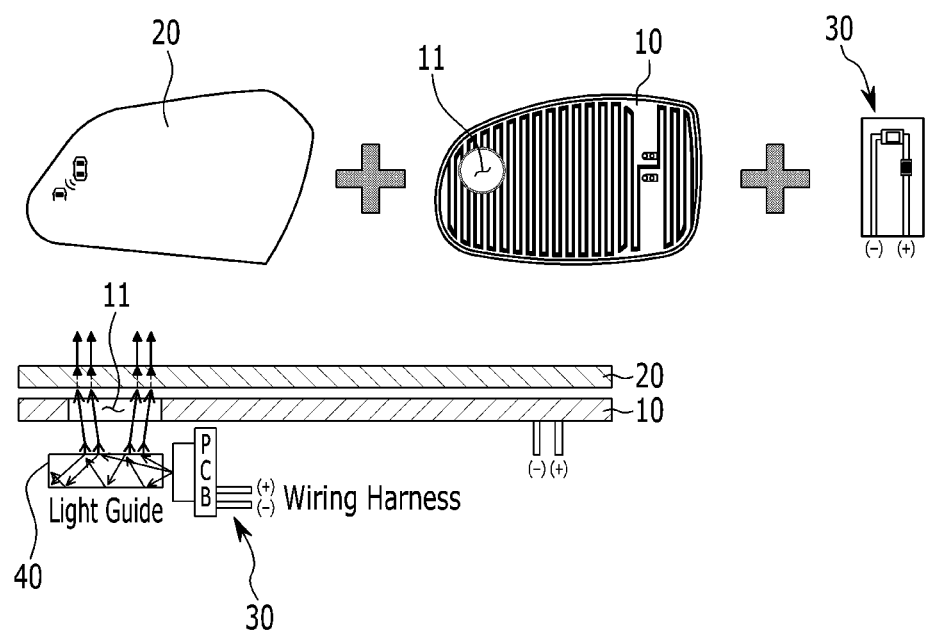
FIG. 1 schematically shows a conventional side mirror structure.
Figure 2:
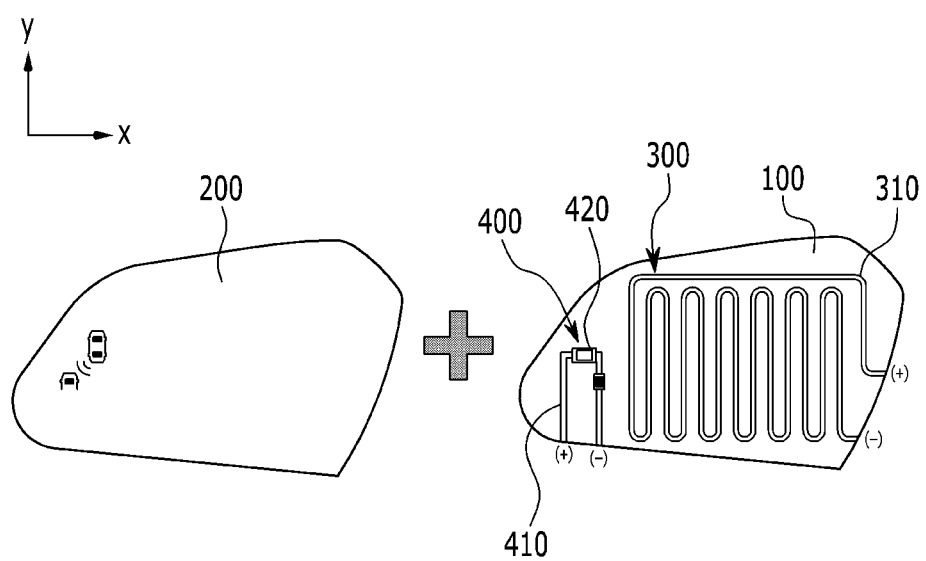
FIG. 2 schematically shows a side mirror according to an exemplary embodiment of the present disclosure.
Figure 3:
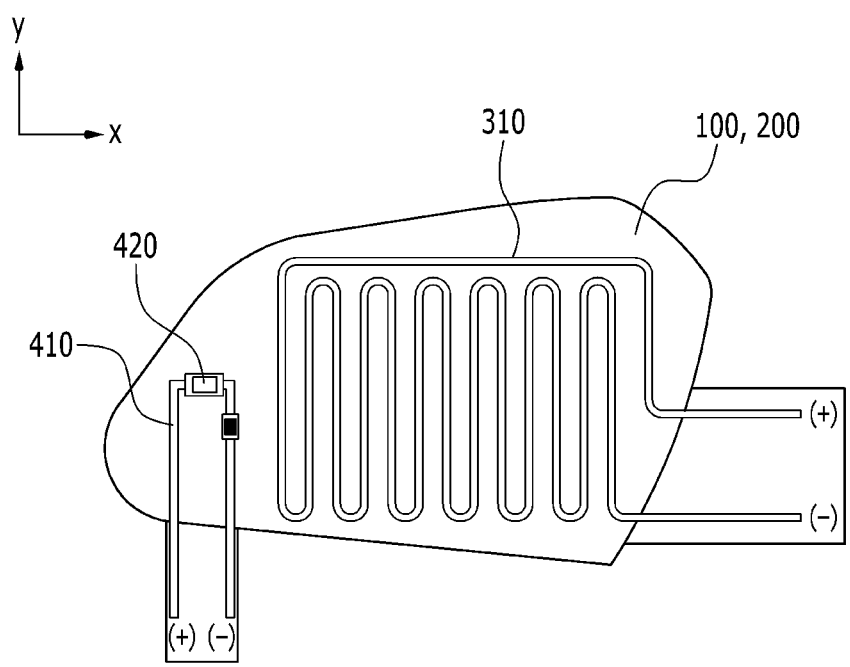
FIG. 3 shows the side mirror according to the exemplary embodiment of the present disclosure, viewed from above.
Figure 4:
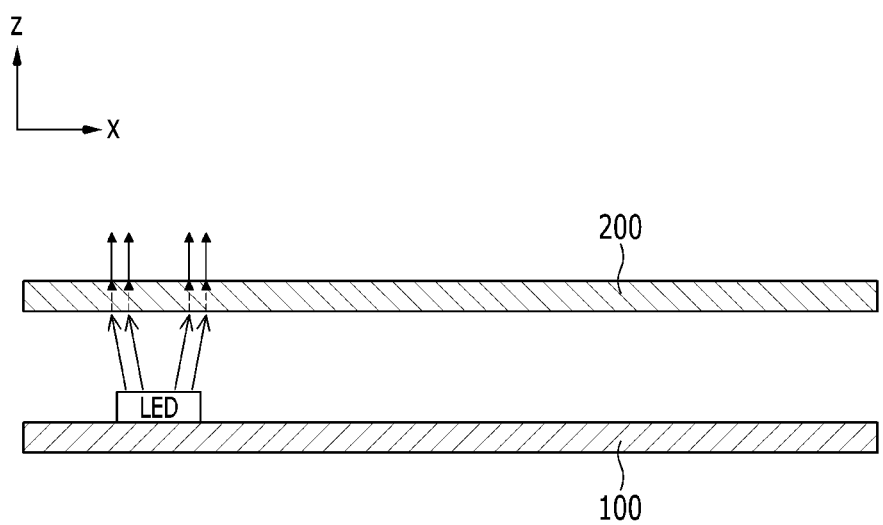
FIG. 4 is a cross-sectional view of the side mirror according to the exemplary embodiment of the present disclosure.

Referring to FIG. 2 to FIG. 4, a side mirror structure according to an exemplary embodiment of the present disclosure includes a substrate 100, a mirror glass 200 disposed above the substrate 100, a heat generation circuit portion 300 that is provided on one side area in a top side of the substrate 100 and transmits heat to the mirror glass 200, and a light emission circuit portion 400 that is provided on the other side area in the top side of the substrate 100 and displays a signal in the mirror glass 200.

A top and bottom direction may be a direction that is represented as the y-axis direction in FIG. 2 and FIG. 3, and an upward direction may imply a direction away from the origin.

A direction from one side to the other side may be a direction that is represented as the x-axis direction in FIG. 2 to FIG. 4, and may be away from the origin toward one side.

The substrate 100 is provided as a printed circuit board in which the heat generation circuit portion 300 is provided in one side area on the top side thereof and the light emission circuit portion 400 is provided in the other side area.

Specifically, a through-hole 110 that vertically penetrates is formed in the substrate 100 such that the one side area and the other side area can be divided. In general, an LED lamp 420 used in the light emission circuit portion 400 is weak to heat and thus a light emission amount may be reduced at a high temperature. Accordingly, a conventional side mirror structure has a spatial limit since a substrate 100 for heat generation and a substrate 100 for light emission are separately provided.

Figure 5:
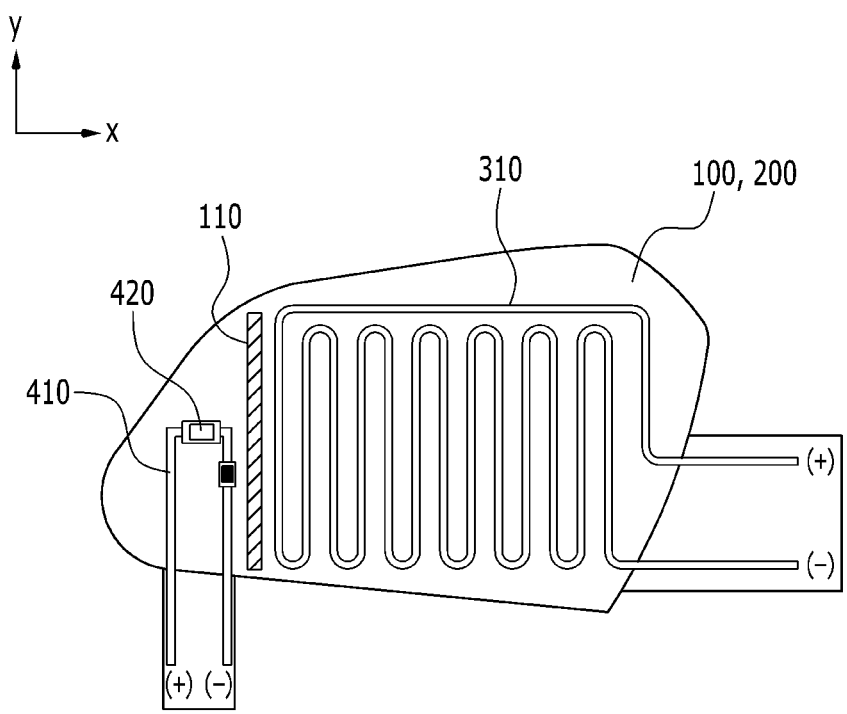
FIG. 5 shows the side mirror according to the exemplary embodiment of the present disclosure, viewed from above.
Figure 6:
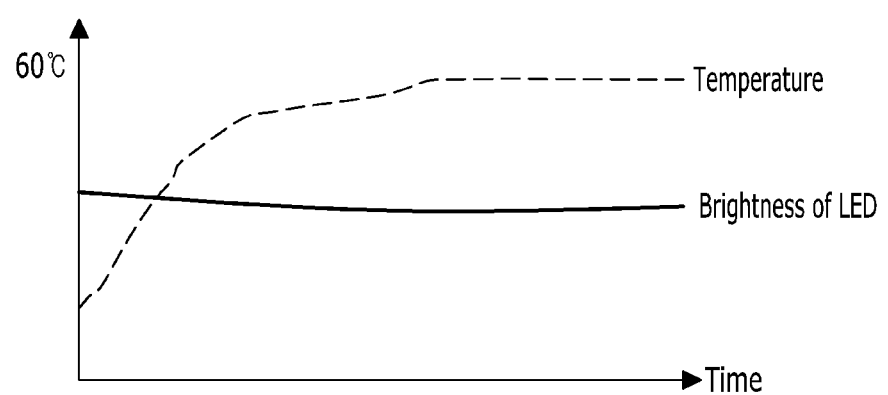
FIG. 6 is a graph that shows time-based temperature and brightness variation of the side mirror according to the exemplary embodiment of the present disclosure.

In the side mirror structure according to an exemplary embodiment of the present disclosure, the heat generation circuit portion 300 and the light emission circuit portion 400 are provided in one substrate 100 as shown in FIG. 5, but the through-hole 110 is provided in the substrate 100 to prevent heat from the heat generation circuit portion 300 from dispersing to the light emission circuit portion 400. Such an effect due to existence of the through-hole 110 can be observed in the graph of FIG. 6.

Thus, even when a temperature of the mirror glass 200 reaches about 60° C. due to the heat generation circuit portion 300, brightness of the LED lamp 420 is maintained at over 95% compared to brightness in the early stage.

Specifically, a width of the through-hole 110 from one side to another side may be 1 mm to 50 mm. When the width is less than 1 mm, heat cannot be effectively blocked, thereby causing deterioration of brightness of the light emission circuit portion 400 due to the heat generation circuit portion 300.

In FIG. 5, the width corresponds to the x-axis, and may correspond to a length formed from one side to the other side.

When the width exceeds 50 mm, an area for wiring of the heat generation circuit portion 300 is relatively reduced, thereby causing an inefficient heat generation effect.

Specifically, the substrate 100 may be formed of a flexible printed circuit board (FPCB) that can be curved or bent. Accordingly, heat generation performance of the heat generation circuit portion 300 can be improved.

A convention heater has a limit in heating performance even though it is provided as a positive temperature coefficient (PTC) heater formed by coating carbon paste to an electrode that is made of an aluminum material. On the contrary, the heat generation circuit portion 300 is formed by applying a copper-based hot wire 310 to the FPCB substrate 100 and accordingly has excellent heating performance.

Figure 7:
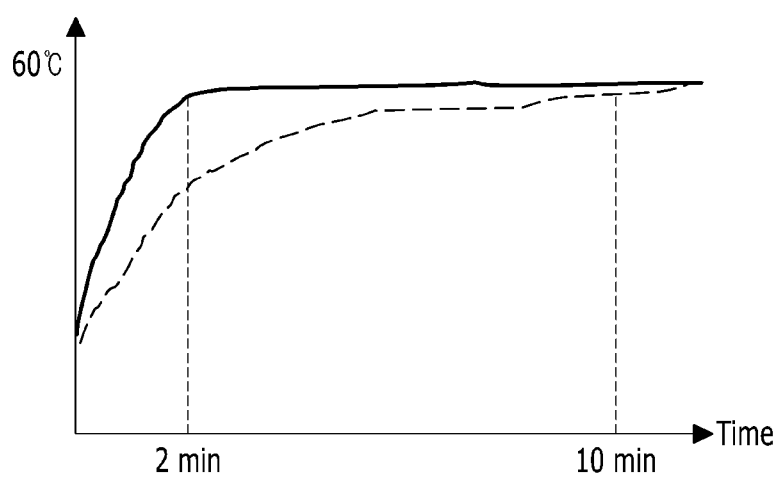
FIG. 7 is a graph that shows time-based temperature variation of a side mirror according to a comparative example and a side mirror of the exemplary embodiment.

The heating performance effect can be observed from the graph of FIG. 7. Compared to a conventional PTC heater according to a comparative example (dotted line), the FPCB-applied heat generation circuit portion 300 according to an exemplary embodiment of the present disclosure (solid line) reaches 60° C. significantly sooner.

The mirror glass 200 serves as a side mirror that is disposed in the upper portion of the substrate 100 to observe a rear side from a driver seat or a passenger seat.

Heat is transmitted to the mirror glass 200 from the heat generation circuit portion 300 provided at one side area on the upper side of the substrate 100 such that moisture or dampness on the mirror glass 200 can be removed. The one side area of the substrate 100 may imply an area that is close to the driver seat or the passenger seat.

Specifically, the heat generation circuit portion 300 is disposed on the substrate 100, and may include the hot wire 310 of which one end of the heat generation circuit portion 300 is connected with a first electrode and the other end is connected with a first counter electrode. The hot wire 310 may be disposed in one area on the upper side of the substrate 100. The hot wire 310 may be provided in a form that is optimized for heat transmission to the mirror glass 200, but the shape thereof is not restrictive. The hot wire 310 may be made of copper or a copper alloy material.

The one end and the other end of the hot wire 310 are respectively connected with the first electrode and the first counter electrode, and the hot wire 310 may generate heat by receiving power from a power source. A wire harness may be provided at one end and the other end of the hot wire 310.

Light is generated from the light emission circuit portion 400 provided at the other area on the upper side of the substrate 100 and thus a signal can be displayed on the mirror glass 200. The other area of the substrate 100 may imply an area that is away from the driver seat or the passenger seat.

Specifically, the light emission circuit portion 400 is disposed on the substrate 100, and may include an electric wire 410 of which one end is connected to a second electrode and the other end is connected to a second counter electrode, and the LED lamp 420 that is electrically connected to the electric wire 410. The electric wire 410 may be disposed on the other area on the upper side of the substrate 100. The hot wire 310 may be made of copper or a copper alloy material. A wire harness may be provided between one end and the other end of the electric wire 410.

The LED lamp 420 is electrically connected with the electric wire 410 and receives power from the power supply, thereby emitting light. Light emitted from the LED lamp 420 may pass through the mirror glass 200 and thus a signal can be displayed on the mirror glass 200.

Specifically, when a vehicle is detected at a rear side direction in a blind spot detection (BSD) system, a BSD logo may be lit on the mirror glass 200 to warn the vehicle driver.

A thickness of a cross-section formed in a vertical direction of the hot wire 310 and the electric wire 410 may be about 10 to 100 µm. When the thickness of the cross-section is less than 10 µm, the conductor resistance may be excessively increased. Particularly, when the thickness of the cross-section of the hot wire 310 is less than 10 µm, the entire area of the mirror glass 200 cannot be heated to a desired temperature.

The thickness corresponds to the z-axis in FIG. 4, and may correspond to a vertical length.

When the thickness of the cross-section exceeds 100 µm, the conductor resistance is too low, thereby causing excessive flow of a current. Accordingly, ignition may occur. In general, in order to prevent occurrence of ignition in wiring, the hot wire 310 or the electric wire 410 may have a pattern gap of about 100 µm, but in this case, a short-circuit may occur between circuits.

Figure 8:
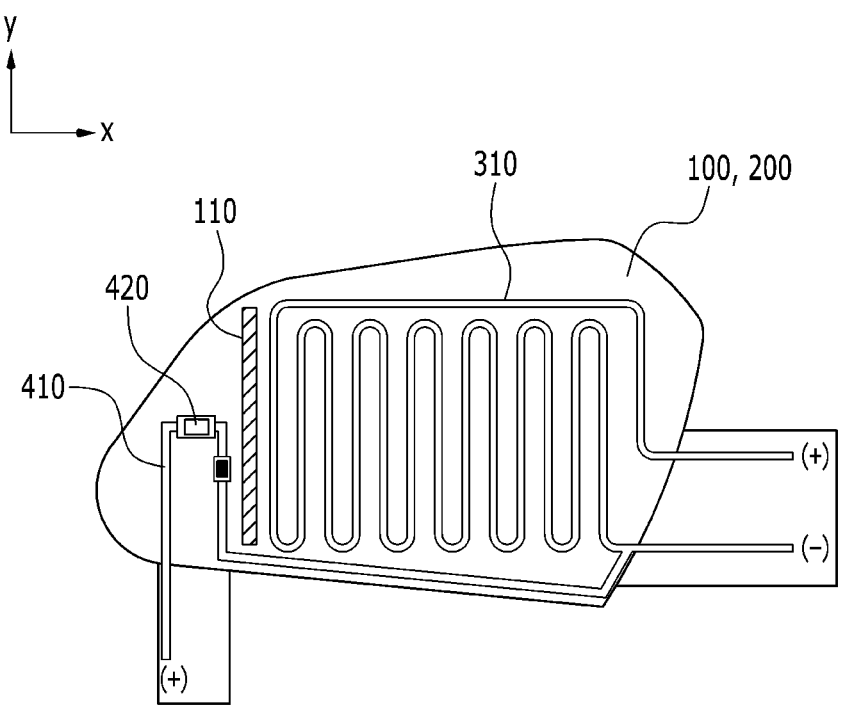
FIG. 8 shows the side mirror according to an exemplary embodiment of the present disclosure, viewed from above.

FIG. 8 shows a side mirror structure according to another exemplary embodiment of the present disclosure. In the side mirror structure according to the present exemplary embodiment, a light emission circuit portion 400 is disposed on a substrate 100, and may include an electric wire 410 of which one side is connected with a second electrode and the other end is connected with a hot wire 310 and an LED lamp 420 that is electrically connected with the electric wire 410. Accordingly, the hot wire 310 and the electric wire 410 may share counter electrodes.

In the side mirror structure according to the present exemplary embodiment, a heat generation circuit portion 300 and the light emission circuit portion 400 are provided on one substrate 100, and accordingly a manufacturing process can be simplified and manufacturing cost can be saved. In addition, the heat generation circuit portion 300 and a wire harness of the light emission circuit portion 400 can be integrally formed, thereby simplifying an assembly process.

Figure 9:
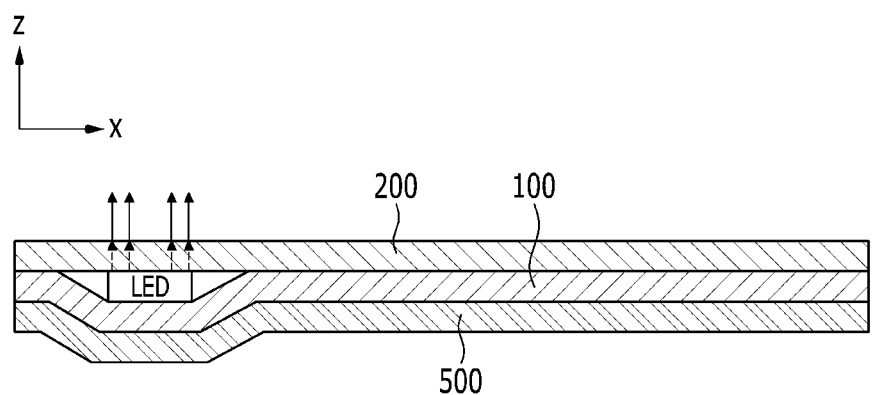
FIG. 9 a cross-sectional view of a side mirror according to another exemplary embodiment of the present disclosure.

As shown in FIG. 9, as an exemplary embodiment of the present disclosure, the mirror glass 200 is disposed while contacting a top surface of the substrate 100, and the side mirror structure according to the exemplary embodiment of the present disclosure may further include a plastic panel 500 that contacts a bottom surface of the substrate 100.

Accordingly, the mirror glass 200, the substrate 100 where the heat generation circuit portion 300 and the light emission circuit portion 400 are formed, and the panel 500 contact each other from the top. When the substrate 100 is provided as an FPCB, which is made of a flexible material, the shape of the substrate 100 may be changed to contact the mirror glass 200 even through the light emission circuit portion 400 exists. The panel 500 contacts the bottom surface of the substrate 100, and may be formed of a plastic material.

Figure 10:
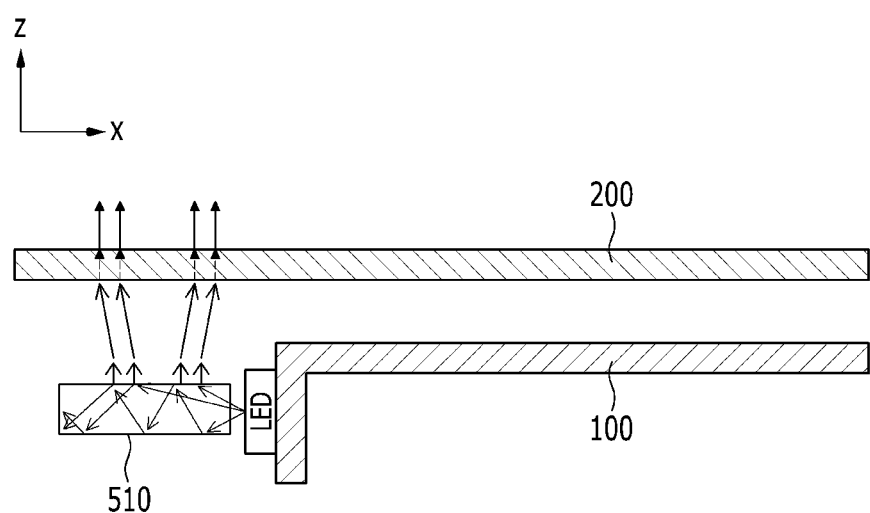
FIG. 10 a cross-sectional view of a side mirror according to another exemplary embodiment of the present disclosure.

As shown in FIG. 10, in a side mirror structure according to another exemplary embodiment of the present disclosure, one area of a substrate 100 is bent downward, and a reflection portion 510 that is disposed at a side of a light emission circuit portion 400 and transmits light emitted from the light emission circuit portion 410 to a mirror glass 200 may be further included.

When the substrate 100 is provided as an FPCB, which is made of a flexible material, the area of the substrate 100 where the light emission circuit portion 400 is formed is bent downward, and the reflection portion 510 is disposed at the side of the light emission circuit portion 400 such that light generated from the light emission circuit portion 400 is transmitted to the mirror glass 200 through the reflection portion, thereby displaying a signal.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, it should be understood that the aforementioned exemplary embodiments are illustrative in terms of all aspects and are not limited.

What is claimed is:

1. A side mirror structure comprising:
   a substrate;
   a mirror glass that is disposed above the substrate;
   a heat generation circuit that is provided at a first area on a top surface of the substrate, and transmits heat to the mirror glass; and
   a light emission circuit that is provided at a second area on the top surface of the substrate, and displays a signal on the mirror glass,
   wherein the substrate includes a flexible material,
   wherein the second area of the substrate is bent downward, and further comprises a reflection that is disposed on a side of the light emission circuit and transmits light generated from the light emission circuit to the mirror glass.

2. The side mirror structure of claim 1, wherein a through-hole, which vertically penetrates the substrate, divides the first area and the second area of the substrate.

3. The side mirror structure of claim 2, wherein a width of the through-hole from one end to another end thereof is about 1 mm to 50 mm.

4. The side mirror structure of claim 1, wherein the heat generation circuit comprises a hot wire disposed on the substrate and having one end connected with a first electrode and another end connected with a first counter electrode.

5. The side mirror structure of claim 4, wherein the light emission circuit comprises:
   an electric wire disposed on the substrate and having one end connected with a second electrode and another end connected with the hot wire; and
   an LED lamp that is electrically connected to the electric wire.

6. The side mirror structure of claim 5, wherein the hot wire and the electric wire include copper or a copper alloy material.

7. The side mirror structure of claim 5, wherein a thickness of a cross-section of each of the hot wire and the electric wire in a vertical direction is about 10 μm to 100 μm.

8. The side mirror structure of claim 1, wherein the light emission circuit comprises:
   an electric wire disposed on the substrate and having one end connected with a second electrode and another end connected with a second counter electrode; and
   a light-emitting diode (LED) lamp that is electrically connected to the electric wire.

9. The side mirror structure of claim 1, wherein the mirror glass is connected to the substrate while contacting the top surface of the substrate, and further comprises a plastic panel that contacts a bottom surface of the substrate.

* * * * *